United States Patent [19]

Suzuki et al.

[11] Patent Number: 4,992,823

[45] Date of Patent: Feb. 12, 1991

[54] IMAGE RECORDING APPARATUS FEASIBLE FOR REPLACEMENT OF IMAGE RECORDING MEDIUM

[75] Inventors: Tsuyoshi Suzuki, Nagoya; Osamu Nagata, Aichi; Makoto Yamada, Gifu; Toshio Sugiura, Nagoya; Eiji Shibata, Nagoya; Kazuhito Ishida, Nagoya; Kazumasa Makino, Nagoya, all of Japan

[73] Assignee: Brother Kogyo Kabushiki Kaisha, Aichi, Japan

[21] Appl. No.: 281,215

[22] Filed: Dec. 8, 1988

[30] Foreign Application Priority Data

Dec. 15, 1987 [JP] Japan .............................. 62-191014[U]
Feb. 12, 1988 [JP] Japan .............................. 63-17646[U]

[51] Int. Cl.⁵ .............................................. G03B 27/32
[52] U.S. Cl. ......................................... 355/27; 355/72
[58] Field of Search ....................... 355/27, 28, 72, 75; 430/136; 354/83, 84

[56] References Cited

U.S. PATENT DOCUMENTS 4,624,560 11/1986 Beery ...................................... 355/27
4,799,085 11/1989 Nagumo et al. ...................... 355/27

Primary Examiner—L. T. Hix
Assistant Examiner—Khanh Dang
Attorney, Agent, or Firm—Oliff & Berridge

[57] ABSTRACT

An image recording apparatus using a microcapsule sheet on which a latent image is formed. The microcapsule sheet is accommodated within a sheet roll cartridge detachably provided to a main frame, and a take up means for winding light-exposed microcapsule sheet thereover. The cartridge and the take-up means are geometrically positioned at an upper portion of the main frame, so that these are easily assembleable and disassembleable. Preferably, a link mechanism is provided which connects a cover member to the cartridge. The link mechanism provides disengagement of the cartridge from the main frame upon opening of the cover member, and provides an engagement therebetween upon closing thereof. Further, additional link mechanism is provided between the cover member and a separation roller unit. The separation roller unit is moved to a first direction where the roller is separated from the microcapsule sheet when the cover member is opened. The unit is moved to a second direction where the roller is in contact with the microcapsule sheet when the cover member is closed.

14 Claims, 7 Drawing Sheets

IMAGE RECORDING APPARATUS FEASIBLE FOR REPLACEMENT OF IMAGE RECORDING MEDIUM

BACKGROUND OF THE INVENTION

The present invention relates to an image recording apparatus such as a copying machine or a printer, and more particularly, to a type thereof in which an elongated continuous web like sheet of photosensitive recording medium is easily changed with a new one. Further, related U.S. Patent Applications have been filed bearing Ser. Nos. 07/281,336 filed on Dec. 8, 1988 (corresponding to Japanese Utility Model application Ser. No. 62-189349) and 07/281,327 filed on Dec. 8, 1988 (corresponding to Japanese Utility Model application Ser. Nos. 62-189350, 62-191005 and 62-191013).

One conventional image recording apparatus or copying apparatus which employs the elongated photosensitive recording medium is shown in FIG. 1. In the apparatus, the recording medium is of transfer type recording medium such as a photosensitive sheet which comprises a microcapsule sheet 306 (first image recording medium) and a developer sheet 309 (second image recording medium). More specifically, in the transfer type recording mediums, the developer material is coated on a separate substrate as a separate developer or copy sheet. The first image recording medium comprises a photosensitive pressure sensitive recording medium provided with microcapsules which encapsulate therein a first material (chromogenic material or dye precursor) having first and second phases dependent on light exposure. The second image recording medium comprises the developer medium provided with a second material (developer material) which provides an output image upon reaction with the first material. Such image recording medium is disclosed in, for example, U.S. Pat. No. 4,399,209 and Japanese patent application Kokai Ser. No. 58-88739.

According to the conventional apparatus 300, there are provided a sheet roll cassette 305 for accommodating therein a non-exposed rolled microcapsule sheet 306 and a take up unit 307 for winding light-exposed microcapsule sheet. These sheet roll cassette or cartridge 305 and the take up unit 307 are disposed at lower positions of the apparatus. More specifically, an original (not shown) is mounted at an original support stand 303 which is covered with a cover member 302, and a light source 301 is disposed below the original support stand 303. A lens 304 is provided between the original support stand 303 and an exposure zone B. Furthermore, a developer sheet cassette 308 is disposed above the exposure zone B, so that each one of the developer sheet 309 is supplied onto the photosensitive sheet 306 at a pressure developing zone 311 by means of a supply roller 310, and is discharged by a discharge roller 312. Therefore, the microcapsule sheet 306 is always positioned below the exposure unit B, the optical components 301, 304, and the developer sheets and their associated components 308, 310.

According to such conventional apparatus, since the installing position of the microcapsule sheet is extremely low, it would be troublesome to take out the entirely light-exposed sheet 306 from the apparatus 300 and to newly assemble the rolled non-exposed microcapsule sheet into the apparatus.

Further, in the conventional apparatus, the sheet roll cassette 305 includes a cartridge shaft 14 engageable with cartridge support shafts 14A as shown in FIG. 2. The sheet roll 306 wound around the cartridge shaft 14 is subjected to a back-tension so as to prevent the sheet in the sheet path from being slackened. This back-tension is applied to the support shafts 14A. When the sheet cartridge 305 is intended to be disassembled from the apparatus, the cartridge support shafts 14A are moved away from the cartridge shaft 14, so that the latter is disengaged from the support shafts 14A. For conducting such movement of the support shafts 14A, a solenoid (not shown) is drivingly connected to the support shaft 14A. However, the employment of the solenoid also requires associated electrical circuit, to thus render the overall apparatus costly, and large noise may be generated during actuation of the solenoid for driving the support shafts 14A.

SUMMARY OF THE INVENTION

Accordingly, it is an object of this invention to provide an image recording apparatus which can facilitate disassembly of an entirely light exposed microcapsule sheet from the apparatus and installation of a new rolled microcapsule sheet thereinto.

To achieve this object, according to this invention, there is provided an image recording apparatus for forming an image on an elongated web like image recording medium, the apparatus defining a sheet path and comprising: main frame defining an upper opening; an exposure unit provided in the frame for exposing the elongated web like image recording medium to light at an exposure table; a developing unit provided in the frame and disposed downstream of the exposure unit with respect to the sheet path for developing the light exposed image recording medium; a sheet roll cartridge provided in the frame and disposed upstream of the exposure unit for accommodating therein non-light exposed elongated web like image recording medium, the sheet roll cartridge having a cartridge shaft detachable from the main frame; and, a detachable take-up means provided in the frame and disposed downstream of the developing unit for winding already exposed image recording medium thereover. The detachable sheet roll cartridge and the detachable take-up means are geometrically positioned at upper portion of the main frame.

With this structure, an operator can be easily accessible to the sheet roll cartridge and the take-up means in his standing posture, so that these are easily assembleable into and disassembleable from the main frame.

According to one preferred embodiment of this invention, there is provided an image recording apparatus for recording an image on an elongated recording medium, the apparatus comprising; a main frame; a cover member pivotally connected to the main frame; a sheet roll cartridge disposed within the frame for accommodating therein the elongated recording medium; a cartridge support shaft supported by the main frame for detachably supporting the sheet roll cartridge; at least one roller (which may be a separation roller) movably supported by the main frame for defining a sheet path of the recording medium within the frame; a first link mechanism connecting between the cover member and the cartridge support shaft, the cartridge support shaft being axially movable in one direction upon opening of the cover member and movable in an opposite direction upon closing thereof; and, a second link mechanism connecting between the cover member and the roller, the roller being movable in a first direction upon opening of the cover and movable in a second direction upon closing thereof.

With the structure, when the cover member is opened, the sheet roll cartridge is automatically disengaged from the cartridge support shaft, so that the cartridge can be easily taken out of the main frame. Further, at this time, the roller is also automatically moved to the first direction, so that the recording medium does not interfere with the roller for taking out the cartridge.

BRIEF DESCRIPTION OF THE DRAWINGS

An embodiment of this invention will be described below with reference to the accompanying drawings in which.

DETAILED DESCRIPTION OF THE PREFERRED EMBODIMENTS

A first embodiment of this invention will be described below with reference to FIGS. 3 thru 5, 7 and 8. The first embodiment employs the above mentioned transfer type image recording medium. However, other photosensitive recording medium is also available.

Figure 3:
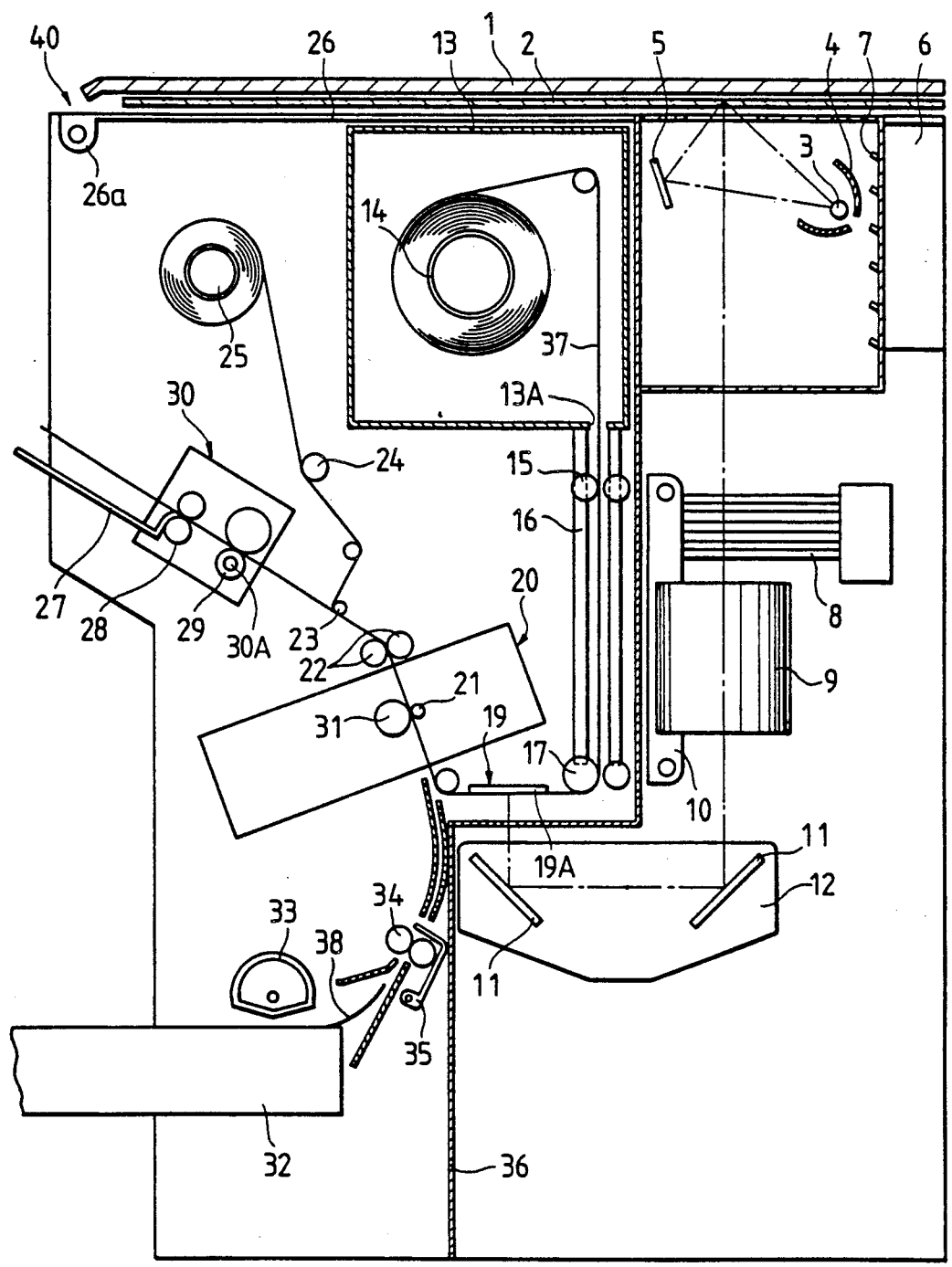
FIG. 3 is a vertical cross-sectional elevation illustrating a copying apparatus according to a first embodiment of this invention.

FIG. 3 shows a copying machine capable of performing a full-color copying. This copying machine employs the above-described transfer type image recording mediums including a microcapsule sheet 37 and a developer sheet 38. As shown in FIG. 3, the copying machine 40 generally includes an exposure unit 19 having an exposure table 19A and a pressure developing unit 20. Further, a light shielding cover plate 36 is disposed in the apparatus to spacedly divide the apparatus into an optical system and other requisite units. The elongated web-like microcapsule sheet 37 is wound around a cartridge shaft 14, and is retained in a microcapsule sheet cartridge 13 that is detachably disposed at a position immediately below an original support stand glass 2 and is formed with a bottom opening 13A. In other words, the cartridge 13 storing therein non light exposed microcapsule sheet 37 is positioned at an upper portion of the apparatus 40. The exposure unit 19 is disposed below the sheet cartridge 13 at a downstream side thereof. The sheet 37 passes through a number of rollers and the pressure developing unit 20, and a leading end of the sheet 37 is attached to a take-up shaft 25 positioned beside the sheet cartridge 13.

Between the sheet cartridge 13 and the exposure unit 19, feed roller 15 and a barrel roller 17 are rotatably provided at a vertical sheet path for guide travel of the sheet toward the exposure unit. At the downstream side of the exposure unit 19, there is provided the pressure developing unit 20 which includes a small diameter roller 21 and a backup roller 31.

At a lower portion of the apparatus 40, there is provided a developer sheet cassette 32 for storing therein a stack of developer sheets 38. Immediately above the cassette 32, a sector roller 33 is provided to feed each one of developer sheet 38 toward the pressure developing unit 20. Between the cassette 32 and the pressure developing unit 20, a roller 34 and a resist-gate 35 are provided so as to align leading edge of the developer sheet 38.

At downstream side of the pressure developing unit 20, a pair of feed rollers 22 are provided so as to provide constant running speed of the microcapsule sheet 37. This speed is coincident with a horizontally moving speed of the original support stand glass 2.

Figure 7:
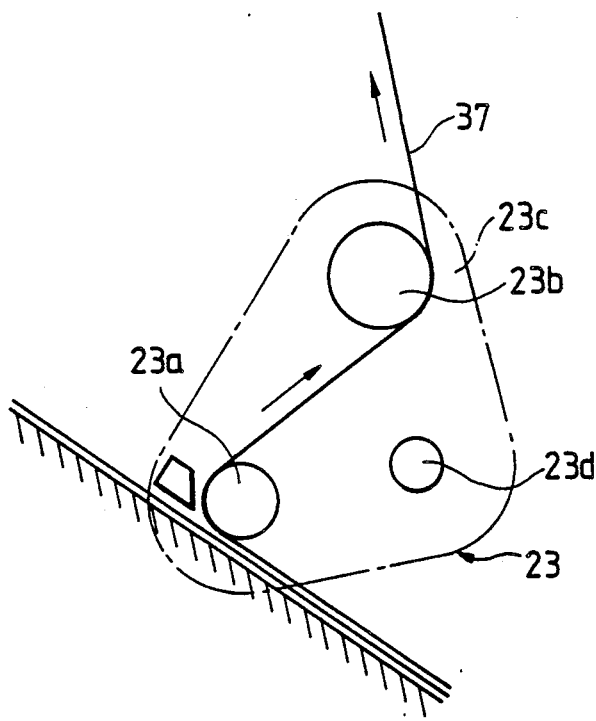
FIG. 7 is a view illustrating a separation roller unit according to this invention, and in which the separation roller unit is at image recording state.
Figure 8:
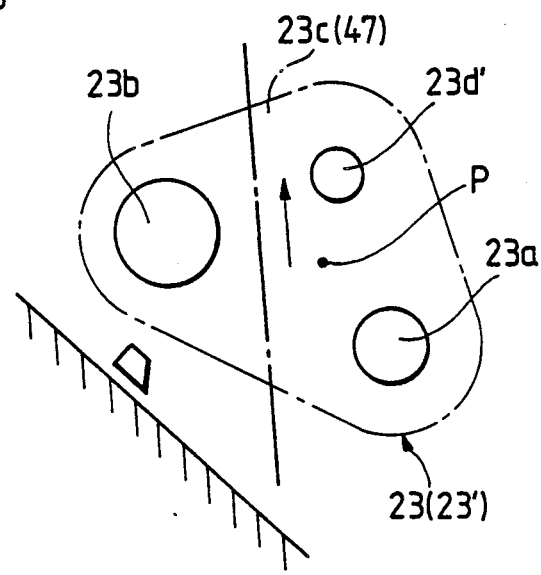
FIG. 8 is a view illustrating the separation roller unit according to this invention, and in which the separation roller unit is at non-image recording state.

At downstream side of the feed rollers 22, a separation roller unit 23 which provides a meandering sheet path as shown in FIG. 7 is provided at which the microcapsule sheet 37 is separated from the developer sheet 38. The separation roller unit includes a plurality of rollers 23a and 23b which are rotatably supported by a sector plate (roller support unit) 23c pivotally connected to a chassis of the apparatus by a pivot pin 23d. For performing sheet separation between the microcapsule sheet 37 and the developer sheet 38, the sector plate 23c is pivoted at a first position as shown in FIG. 7 so as to provide the meandering sheet path. On the other hand, when the sheet removal from the apparatus is intended, the sector plate 23 is pivoted to a second position as shown in FIG. 8 so as to allow the separation rollers 23a and 23b from moving away from the microcapsule sheet 37, so that the latter is easily disassembled from the separation roller unit 23. Such pivotal movement of the sector plate 23c is achieved by, for example, a solenoid (not shown) connected to the unit 23.

The separate microcapsule sheet 37 is taken-up by the above mentioned take up means 25 through a meander travel control roller 24. On the other hand, thermal fixing unit 30 is provided at the downstream side of the separation roller 23. The thermal fixing unit 30 includes a hollow heat roller 29 in which a heater element 30 is disposed. Further, a developer sheet feed roller 28 is provided to feed the image fixed developer sheet 38 toward a discharge tray 27.

Figure 1:
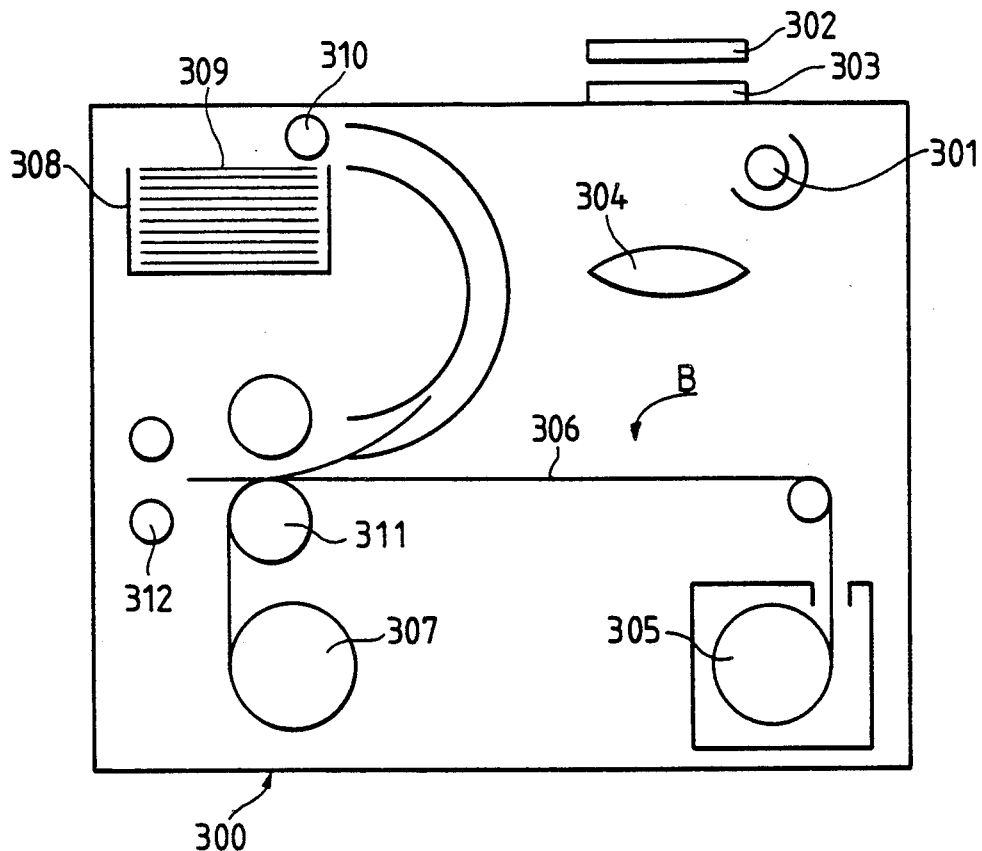
FIG. 1 is a schematic cross-sectional elevation illustrating a conventional image recording apparatus.
Figure 2:
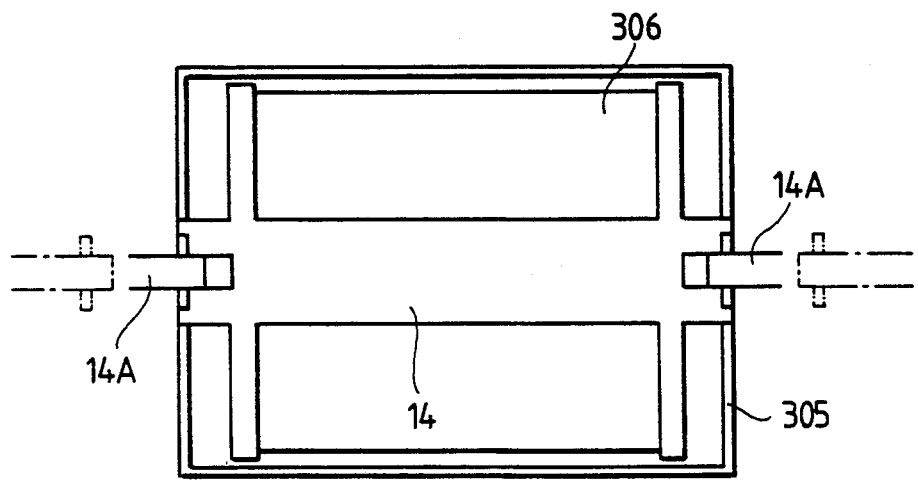
FIG. 2 is a schematic view showing the rolled sheet cartridge according to a conventional image recording apparatus.

As shown in FIG. 3, the copying machine 40 has its top plate portion provided with a stand cover 1 and the original support stand glass 2. The original support stand glass is formed of light transmissive material and is movable in the horizontal direction and on which a desired original (not shown) is to be placed. Further, an inner cover 26 is hingedly supported to a main frame as at 26a. At the upper one side section (right side in FIG. 1) of the copying machine 40, fixedly provided is a light source including a linear halogen lamp 3 extending in the direction perpendicular to the moving direction of the original support stand glass 2, and a semi-cylindrical reflector 4 disposed to surround the lamp 3. The light source emits a linear-line light ray to the original support stand glass 2.

Therefore, the light emitted from the halogen lamp 3 can be sequentially irradiated on the entire surface over the region from the one to another ends of the original support stand glass 2 in accordance with the horizontal movement of the glass 2. The light from the light source passes through the transparent original support stand glass 2 and is reflected at the original mounted thereon. The original support stand cover 1 which covers the top surface of the glass 2 is provided in order to prevent this light from leakage out of the apparatus.

To irradiate the light from the halogen lamp 3 on the original at a high efficiency, a flat reflector 5 is disposed on one side of the light source. The second reflector 5 is adapted to reflectingly direct lights which do not directly direct toward the original from the light source and concentrate such reflected light onto the original.

At another side of the halogen lamp 3 there is provided a fan 6 and a louver 7 for introducing an external air into the apparatus. Accordingly, air is effectively impinged onto the light source 3 to cool the same.

A filter 8 is disposed below the original support stand glass 2. Further, a lens 9 is provided below the filter 8. Light emitted from the halogen lamp 3 and reflected at the original placed on the original support stand glass 2 passes through the filter 8 and enters the lens 9. The filter 8 alters the light transmissive characteristic in accordance with the sensitivity characteristics of a microcapsule sheet 37, to thereby adjust the color tone of a copied output image. The lens 9 is fixedly secured to a lens mounting plate 10, and fine angular adjustment of this lens with respect to a light path is achievable. A pair of reflection mirrors 11 and 11 are provided below the lens 9. The condensed lights passing through the lens 9 change their direction by 180 degrees (completely reverse direction) by the two reflection mirrors 11 and the thus oriented lights impinge on the microcapsule sheet 37 closely contacting the bottom of the exposure table 19A to form the latent image thereon. The two reflection mirrors 11 are securely mounted to a mirror mounting plate 12, so that the adjustment of the length of the light path and focusing adjustment can be effected by fine adjustment of the position of the mirror mounting plate 12.

In general operation of the copying apparatus, the microcapsule sheet 37 taken out through the opening 13A of the cartridge 13 is fed by the feed rollers 15 and guided by the barrel roller 17. The sheet 37 then passes in contact with a lower face of the exposure table 19A where original image carrying light is applied to the sheet 37, so that a latent image is formed on the sheet 37. The sheet is then fed to the pressure developing unit 20 by the guide roller 17. At the pressure developing unit, the sheet 37 is pressurizingly superposed with the developer sheet 38. The microcapsule sheet 37 passing through the pressure developing unit 20 is then guided by the separation roller 23 and the meander travel adjusting roller 24 and is wound around the take-up shaft 25. An unexposed portion of the microcapsule sheet 37 leaving the cartridge 13 is kept unexposed to light by the shielding cover 36.

Since the conveying speed for the microcapsule sheet 37 is controlled to be constant by feed rollers 22 and is set equal to the moving speed of the original support stand glass 2, line latent images having given widths are sequentially formed on the microcapsule sheet 37 that is passing under the exposure table 19A.

The developer sheets 38 are fed out one by one by the sector or woodruff roller 33, and each sheet 38 is fed to a sheet inlet of the pressure developing unit 20 after leading edge of the sheet 38 is aligned by developer sheet rollers 34 and the resist gate 35.

Accordingly, the microcapsule sheet 37 and the developer sheet 38 are fed, in close contact therewith, to the pressure developing unit 20. The microcapsule-carrying surface of the microcapsule sheet 37 on which a latent image is formed contacts the developer-coated surface of the developer sheet 38 at a position inside the pressure developing unit 20, and these superposed sheets are pressed together by the small roller 21 and the backup roller 31. Unexposed microcapsules are ruptured by the applied pressure, to thereby form an output image on the developer sheet 38 because of the reaction of chromogenic material with the developer material.

The microcapsule sheet 37 and developer sheet 38 leaving the pressure developing unit 20 are fed out by the feed rollers 22 and are separated by the separation roller 23, the former sheet 37 directing upward and the latter sheet 38 directing in the straight direction. After color development of the developer sheet 38 is progressed by the thermal fixing unit 30, this sheet 38 is fed out, with its image surface up, on a discharge tray 27. On the other hand, the separated microcapsule sheet 37 passes through the meandering control roller 24 and is wound around the take-up shaft 25.

Operation of the copying apparatus in conjunction with the movement of the original support stand glass 2 will be described:

The original support stand cover is lifted up for mounting the original on the original support stand glass 2. Then, when a start button (not shown) is depressed, the original support stand glass 2 is moved to one direction (rightwardly in FIG. 1), so that one side edge of the glass 2 (left side edge in FIG. 1) stops at a first position where the one side edge of the glass 2 is coming into confrontation with the light source. Thereafter, with the halogen lamp 3 being lighted, the original support stand glass 2 is then moved in a second direction (leftwardly in FIG. 1) opposite to the first direction. The light emitted from the halogen lamp 3 is reflected at the original, and the reflected light passes through the filter 8 and lens 9 and is reflected at two reflection mirrors 11. The last reflected light is finally directed toward the microcapsule sheet 37 which is located under the exposure table 19A to form the latent image on the sheet 37. At this time, since the microcapsule sheet 37 is moved under the exposure table 19A in the second direction (leftwardly in FIG. 1) at the same speed as the moving speed of the original support stand glass 2, the latent image corresponding to the original image is successively formed on the microcapsule sheet 37.

In timed relation with the movement of the original support stand glass 2 in the second direction, the sector roller 33 feeds out the developer sheets 38 one by one from the developer sheet cassette 32. The developer sheet 37 superposed on the light-exposed microcapsule sheet 37 is fed to the pressure developing unit 20, and the latent image on the microcapsule sheet 37 is developed and transferred onto the developer sheet 38.

Thereafter, the developer sheet 38 is subjected to thermal fixing in the thermal fixing unit 30 and is then discharged outside the copying machine 40. Meanwhile, the microcapsule sheet 37 leaving the pressure developing unit 20 is wound around the take-up shaft 25. When the movement of the original support stand glass 2 is stopped at a second position where another edge (right side in FIG. 1) of the glass 2 confronts the light source, the copying of the original is completed and the halogen lamp 3 is turned off.

According to the first embodiment, there is further provided a link mechanism connected between the inner cover member 26 and the sheet roll cartridge 13 for facilitating exchange of sheet cartridge 13. That is, if the microcapsule sheet is completely discharged from the sheet cartridge 13 and is wound over the take-up shaft 25, it is necessary to disassemble the used microcapsule sheet 37 wound over the take up shaft 25 and to disassemble the empty sheet cartridge 13 from the apparatus 40, and further, a new sheet cartridge 13 accommodating therein a new microcapsule sheet roll 37 must be assembled thereinto. In the first embodiment, such operation is achievable mechanically, not electrically excluding the employment of a solenoid.

Figure 4:
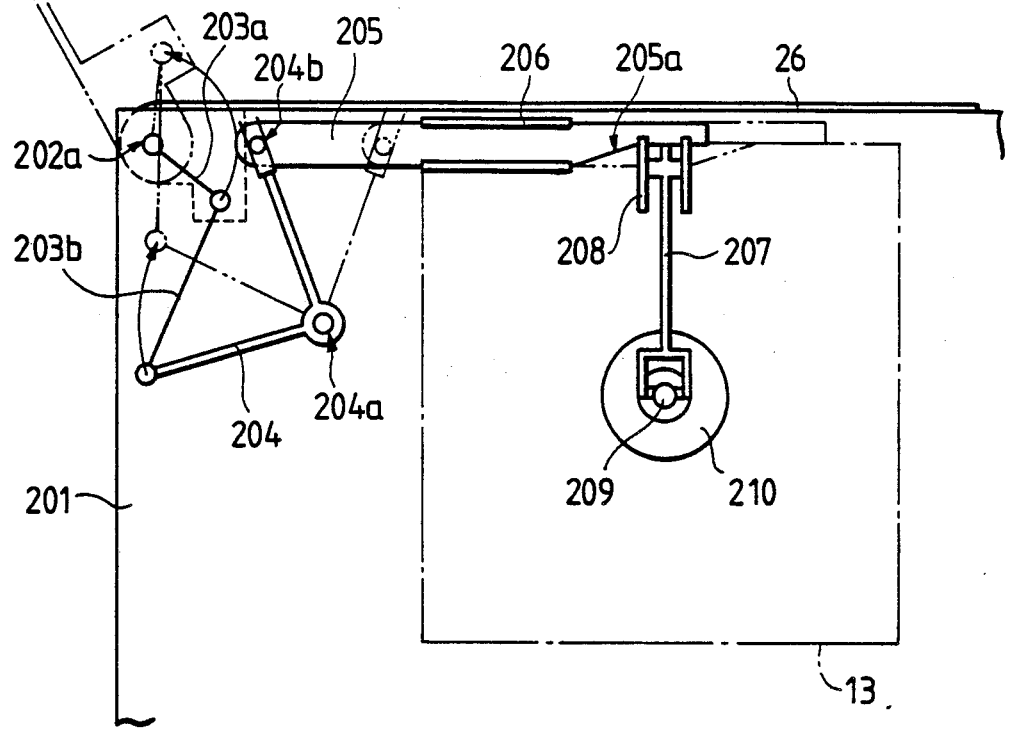
FIG. 4 is a front view illustrating a rolled sheet cartridge and its associated mechanism (a first link mechanism) according to the first embodiment of this invention.
Figure 5:
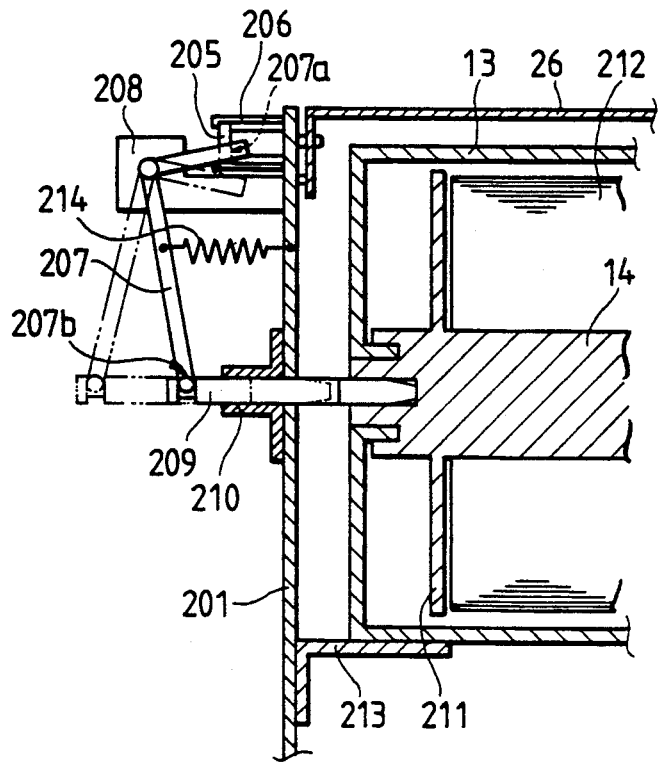
FIG. 5 is a cross-sectional view showing the rolled sheet cartridge and its associated mechanism according to the first embodiment.

To be more specific, as shown in FIGS. 4 and 5, the inner cover member 26 is pivotally supported to a chassis 201 by a hinge 202a, and one end of a first arm 203a is rotatably connected to the hinge 202a. The first arm 203a has another end pivotally connected to one end of a second arm 203b, whose another end is pivotally connected to one end of a V-shaped bell crank member 204. The crank member 204 is pivotable about a stationary pivot shaft 204a, and has another end connected to one end portion of a slider 205 through a link mechanism 204b. In response to the pivotal movement of the cover member 26, the crank member 204 is pivoted between its first position (shown by a solid line) and a second position (shown by a phantom line) a stationary guide 206 is provided to the chassis 201, so that the slider 205 is slidable in horizontal direction with respect to the guide 206. The slider 205 has another end portion provided with a slanting cam surface 205a.

As best shown in FIG. 5, an L-shaped lever member 207 has an intermediate portion pivotally supported to a boss 208 extending from the chassis 201. One end 207a of the lever member 207 is in slide contact with the cam surface 205a. Therefore, when the slider 205 is moved in its longitudinal direction, the lever member 207 is pivoted because of the contact between the cam surface 205a and the one end of the lever 207. A tension spring 214 is connected between the lever member 207 and the chassis 201 so as to normally bias the one end 207a of the lever member 207 toward the cam surface 205a.

Another end 207b of the lever member 207 is engaged with a supporting shaft 209 which is engageable with the sheet cartridge shaft 14. That is, the supporting shaft 209 is provided coaxial with the sheet cartridge shaft 14 and is selectively coupled to the shaft 14 upon actuation of the lever member 207. The sheet cartridge shaft 14 is integrally provided with a pair of flanges 211 between which the rolled microcapsule sheet 212 is positioned. Further, a cartridge support plate 213 extends inwardly from the chassis 201 so as to mount the sheet cartridge 13 thereon. Further, a sleeve member 210 extends outwardly from the chassis 201 so as to rotatably support the supporting shaft 209. The supporting shaft 209 is provided slidable in axial direction thereof with respect to the sleeve member 210 for selective coupling to the cartridge shaft 14. Incidentally, in FIGS. 4 and 5, a phantom line designates a state where the inner cover member is fully opened, and solid line designates a state where the inner cover member is closed. Further, it goes without saying that exactly identical chassis is positioned at opposite side of the apparatus so as to provide the above mentioned mechanism for assembling and disassembling the sheet cartridge 13.

With the structure thus organized, during an image recording operation where non-used microcapsule sheet 212 still remains in the cartridge 13, the inner cover member 26 is completely closed. In this state, the one end portion 207a of the lever 207 is in contact with the most highest portion of the cam surface 205a, since the slider 205 is positioned at the most leftward position in FIG. 4. Therefore, the supporting shaft 209 maintains engagement with the cartridge shaft 14 as shown by the solid line in FIG. 5. Accordingly, a back-tension is applied to the sheet roll 212 through the supporting shaft 209.

On the other hand, when the sheet roll 212 is completely pulled out of the cartridge 13, the cartridge 13 together with the take-up shaft 25 must be disassembled from the apparatus. For this, the inner cover member 26 is opened, so that the crank member 204 is pivoted about the pivot shaft 204a to the second direction (clockwise direction in FIG. 4) through the arms 203a and 203b. As a result, the slider 205 is moved rightwardly in FIG. 4 along the guide 206. By this movement of the slider 205, the one end portion 207a of the lever 207 is brought into contact with the slanting portion of the cam surface 205a, so that the lever 207 is pivoted to provide a position shown by the phantom line in FIG. 5. By this pivotal movement of the lever 207, the other end portion 207b of the lever 207 pulls the supporting shaft 209, so that the latter is disengaged from the cartridge shaft 14. Accordingly, the sheet cartridge 13 is released from the chassis 201, and can be taken out of the apparatus 40 through an upper opening provided by the open motion of the inner cover member 26. In this instance, the take-up shaft 25 winding thereover a used microcapsule sheet roll is also taken out (not shown). Further, the separation roller unit 23 is pivoted by the solenoid to obtain a posture shown in FIG. 8, so that the photosensitive sheet is not interfered with the rollers 23a and 23b.

If a new sheet roll cartridge 13 is intended to be assembled, a new take-up shaft 25 is firstly assembled through the upper opening, and the new cartridge 13 is mounted on the support plate 213 through the upper opening. Then, by closing the inner cover member 26, the cartridge supporting shaft 209 is brought into engagement with the cartridge shaft 14 by the above mentioned mechanism in a manner quite reverse to the sheet cartridge disassembling operation.

In view of the above, the sheet cartridge 13 is easily assembled or disassembled with respect to the chassis 201. Incidentally, when the sheet cartridge 13 is assembled, the cartridge shaft 14 always extends in parallel with the take-up shaft 25, since the front and rear chassis have configurations identical with each other to support both ends of the shafts 14 by each of the supporting shafts 209 209 in axial alignment with one another. Accordingly, inadvertant microcapsule diagonal travel can be obviated.

A second embodiment according to this invention is shown in FIGS. 6 through 11. According to the first embodiment, the separation roller unit 23 is pivoted by the employment of the solenoid. However, according to the second embodiment, the pivotal movement of the separation roller unit 23 is also attainable mechanically in response to the hinged opening movement of the inner cover member 26 simultaneous with the disengagement of the supporting shaft from the sheet cartridge shaft 14.

Figure 6:
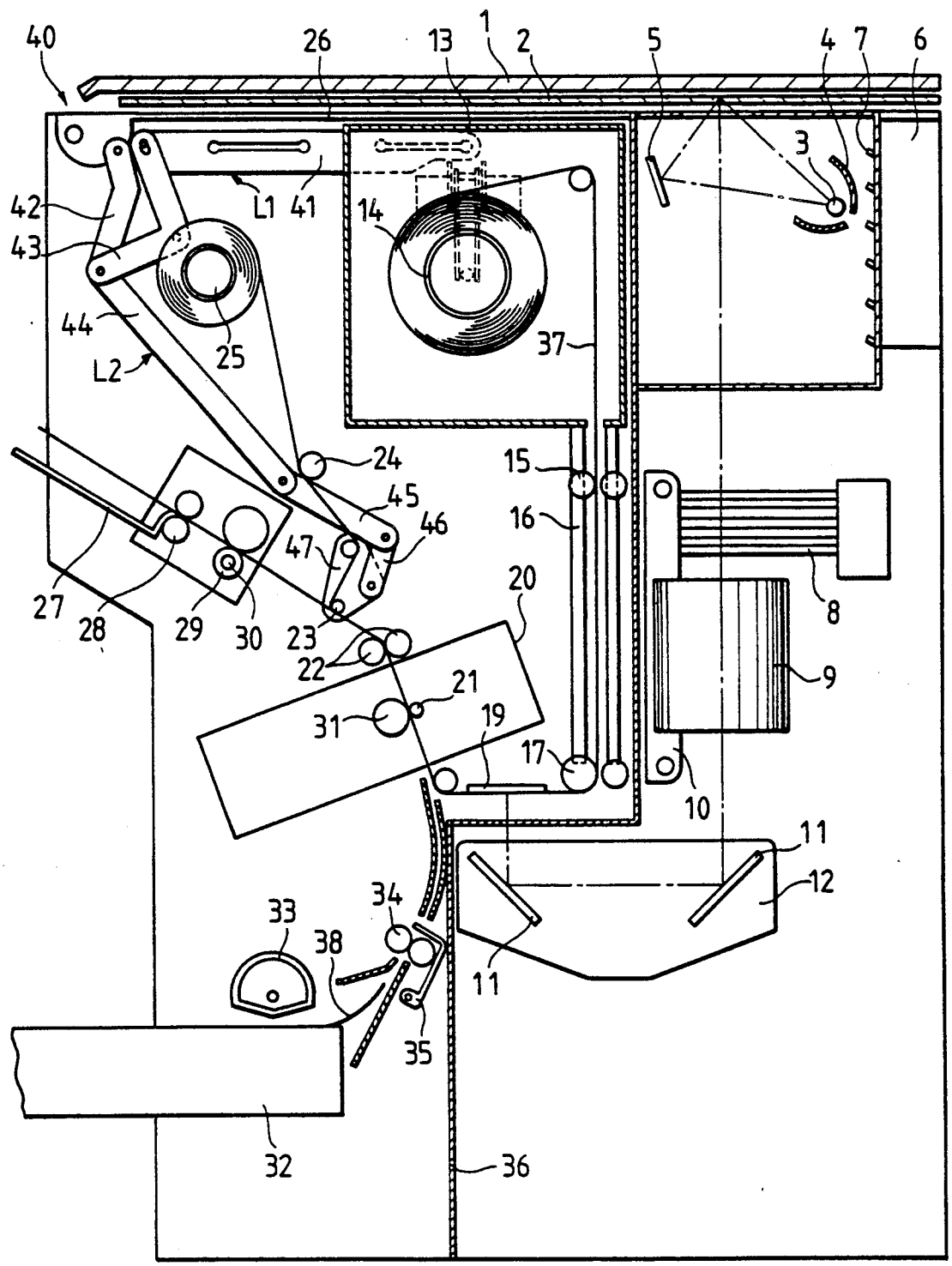
FIG. 6 is a vertical cross-sectional elevation illustrating a copying apparatus according to a second embodiment of this invention.

As shown in FIG. 6, an image recording apparatus 40' has a structure similar to that of the first embodiment. However, in the second embodiment, there are provided a first linking mechanism L1 and a second linking mechanism L2. The first linking mechanism L1 is connected between the inner cover member 26 and a sheet cartridge 13, and the second linking mechanism L2 is connected between the inner cover member 26 and a separation roller unit 23'. The first linking mechanism L1 corresponds to the mechanism in the first embodiment shown in FIGS. 4 and 5.

The second linking mechanism L2 will be described with reference to FIGS. 9 and 10. Similar to the first embodiment, the inner cover member 26 is hingedly supported to the apparatus 40', and the second linking mechanism L2 includes a first link 42, a second link 44, a third link 45 and a fourth link 46. The first link 42 has one end pivotally connected to one end portion of the inner cover member 26 by a pin 53, and has another end fixing with a pin 54 about which one end of the second link or a crank 44 is provided pivotable. The second link 44 has another end fixed with a pin 55 about which one end of the third link 45 is provided pivotable. Another end of the third link 45 secures a pin 56 about which one end of the fourth link 46 is provided pivotable. Another end of the fourth link 46 secures a pin 57 to which a sector plate or roller frame 47 of the separation roller unit 23' is pivotally connected. According to the second embodiment, the sector plate 47 is pivotally supported to the main frame of the apparatus 40 at a pivot axis P as shown in FIG. 8(b).

Figure 11:
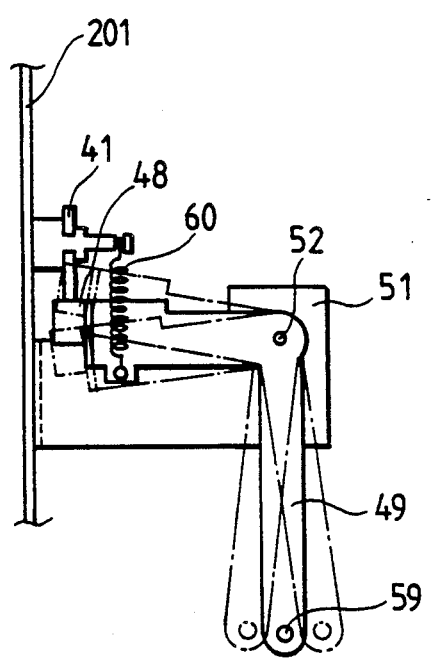

The first linking mechanism L1 will be described. The first linking mechanism L1 generally includes a first bell crank member 43, a slider 41 and a second bell crank member 49. The first bell crank member 43 has one end pivotally connected to the pin 54, an intermediate portion pivotally connected to the main frame of the apparatus by a pin 43a, and another end portion formed with a slot 43b. The slider 41 is disposed slidable in horizontal direction between its first position (FIG. 9) and a second position (FIG. 10). The slider 41 has one end portion provided with a pin 58 with which the slot 43b of the first bell crank member 43 is engageable. The slider 41 has another end portion whose lower face is formed with a cam surface 41a. Upon pivotal movement of the inner cover member 26, the first link 42 is moved, so that its another end is also moved, to thereby pivot the first bell crank member 43 about the pin 43a, to thus move the slider 41 in horizontal direction. The second bell crank member 49 has one end provided with a cam follower 48 which is in slide contact with the cam surface 41a of the slider 41. As best shown in FIG. 11, a projection member 51 extends from a chassis 201 of the main frame, and the second bell crank member 49 is pivotally supported to the projection member 51 by a pivot pin 52. Further, a tension spring 60 is connected between the one end portion of the second bell crank member 49 and the chassis so as to normally urge the cam follower 48 toward the cam surface 41a. Another end portion of the second bell crank member 49 is provided with a pin 59 which is connected to a supporting shaft 50 which engageably support the cartridge shaft 14 similar to the first embodiment.

Figure 9:
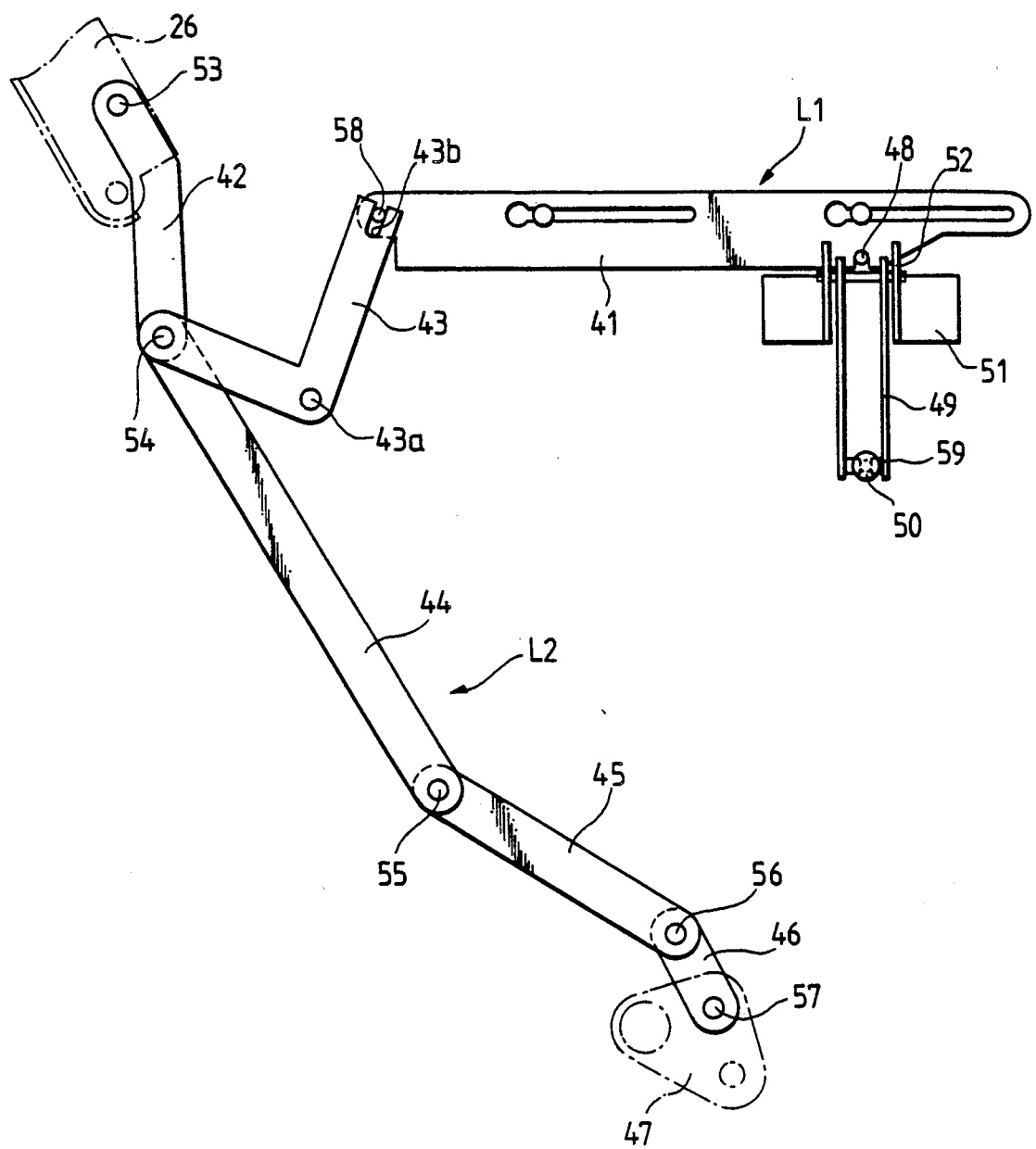
FIG. 9 is a front view showing a mechanism (first and second link mechanisms) associating with a rolled sheet cartridge and the separation roller unit according to the second embodiment of this invention, and in which a cover member is opened.

With the structure, when the inner cover member 26 is closed, the slider 41 is at the first position shown in FIG. 9. On the other hand, when the cover member 26 is opened, the first link 42 connected to the cover 26 is also lifted, so that the first bell crank 43 is pivoted about the pivot pin 43a, to thereby move the slider 41 toward the second position shown in FIG. 10. By this movement of the slider 41, the cam follower 48 initially contacting with the highest position of the cam surface 41a is gradually moved to its descent position because of the slanting orientation of the cam surface 41a against the biasing force of the spring 60. Accordingly, the second bell crank member 49 is pivoted about the pivot pin 52, to thereby move the other end of the second bell crank member 49. By this movement, the supporting shaft 50 is disengaged from the cartridge shaft 14, so that the sheet roll cartridge 13 can be disassembled from the apparatus 40'.

Figure 10:
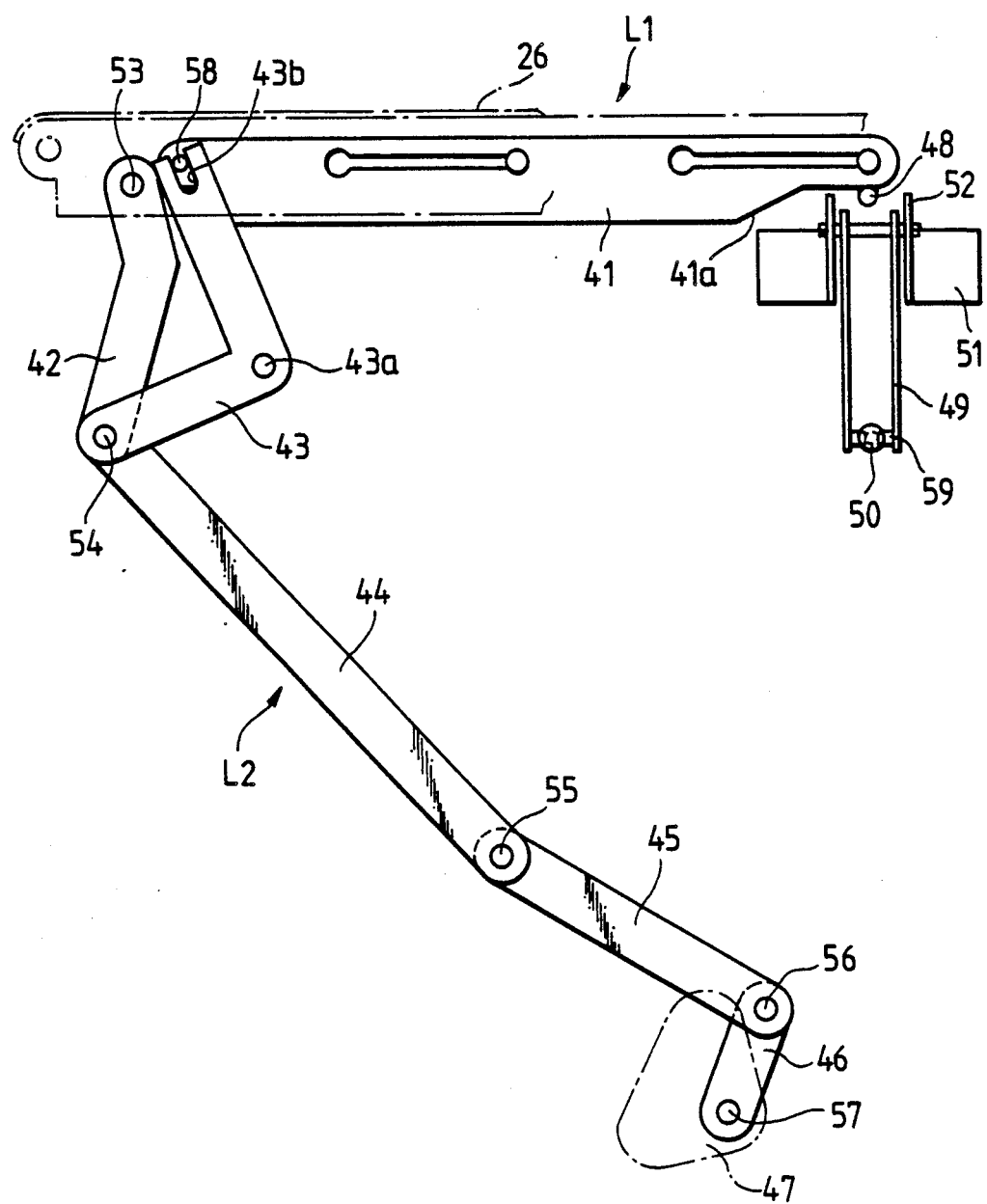
FIG. 10 is a front view showing the mechanism associating with a rolled sheet cartridge and the separation roller unit according to the second embodiment of this invention, and in which the cover member is closed; and, FIG. 11 is a side view showing the mechanism associating with the rolled sheet cartridge according to the second embodiment.

Simultaneously, upon opening the inner cover member 26, because of the mechanical interconnection between the cover member 26 and the separation roller unit 23 by means of the second link mechanism L2, the sector plate 47 is pivoted about the pivot axis P as shown in FIG. 10, since the pivot pin 57 is pulledly urged by the fourth link 46. As a result, the separation rollers 23a, 23b previously providing the meandering sheet path will also be moved, so that these rollers are moved away from the microcapsule sheet 37 for facilitating free sheet removal at that portion. It goes without saying that exactly opposite mechanical movements are conducted if the inner cover member 26 is closed.

As described above, according to the present invention, since the sheet roll cartridge 13 and the sheet take-up means 25 are disposed at the upper portion of the apparatus, it is easy to assemble and disassemble the cartridge and the take-up means relative to the apparatus. Further, in the present invention, since the sheet roll cartridge 13 is automatically disengaged from the apparatus upon opening of the cover member, and is automatically engaged therewith upon closure thereof because of mechanical interconnection between the cover member and the sheet cartridge 13, resultant apparatus can be economically provided without using any electrical unit such as solenoid. Furthermore, according to the second embodiment of this invention, the separation roller unit is also mechanically interconnected with the inner cover member, and therefore, the separation rollers are easily movable for providing a free sheet passage, to thus further improve microcapsule sheet exchanging operation.

While the invention has been described in detail and with reference to specific embodiments thereof, it would be apparant for those skilled in the art that various changes and modifications can be made therein without departing from the spirit and scope of the invention.

What is claimed is:

1. An image recording apparatus for forming an image on an elongated web like image recording medium, said apparatus defining a sheet path in which the elongated web like image recording medium moves in one direction and comprising:
- a main frame defining an upper opening;
- an exposure unit provided in said main frame and including an exposure table located along said sheet path for exposing said elongated web like image recording medium to light;
- a developing unit provided in said main frame and disposed on said sheet path downstream of said exposure table with respect to said sheet path for developing said light exposed image recording medium;
- a sheet roll cartridge provide in said main frame disposed on said sheet path upstream of said exposure table with respect to said sheet path for accommodating therein non-light exposed elongated web like image recording medium, said sheet roll cartridge having a cartridge shaft detachable from said main frame; and
- a detachable take-up means provided in said main frame and disposed on the sheet path downstream of said developing unit with respect to said sheet path for winding already exposed image recording medium thereover; said detachable sheet roll cartridge and said detachable take-up means being geometrically positioned at an upper portion of said main frame.

2. The image recording apparatus as defined in claim 1 wherein said image recording medium comprises a first image recording medium and a second image recording medium, said first image recording medium comprising a photosensitive pressure sensitive recording medium provided with microcapsules, said microcapsules encapsulating therein a first material having first and second phases dependent on light exposure, and said second image recording medium comprising a developer medium provided with a second material which provides an output image upon reaction with said first material, said photosensitive pressure sensitive recording medium being accommodated in said sheet roll cartridge and positioned at said sheet path.

3. The image recording apparatus as defined in claim 1 wherein said exposure table is positioned below said sheet roll cartridge.

4. The image recording apparatus as defined in claim 1 wherein said exposure table is positioned below said take-up means.

5. The image recording apparatus as defined in claim 2 wherein said exposure table is positioned below said sheet roll cartridge.

6. The image recording apparatus as defined in claim 2 wherein said exposure table is positioned below said take-up means.

7. The image recording apparatus as defined in claim 2 further comprising a cover member having one end pivotally connected to said main frame to selectively open said upper opening of said main frame.

8. The image recording apparatus as defined in claim 7 further comprising a first link mechanism provided between said one end portion of said cover member and said cartridge shaft, said first link mechanism disengaging said cartridge shaft from said main frame upon opening of said cover member and engaging said cartridge shaft with said main frame upon closing said cover member.

9. The image recording apparatus as defined in claim 8 further comprising a supporting shaft disposed slidable with respect to said main frame, said supporting shaft being selectively engageable with said cartridge shaft; and wherein said first link mechanism comprises;
- an arm member having one end pivotally connected to said one end portion of said cover member, and having another end;
- a first crank member having one end pivotally connected to said another end of said arm member, an intermediate portion pivotally supported to said main frame, and having another end;
- a slider member disposed slidable with respect to said main frame; said slider having one end portion engageable with said another end of said crank member and another end portion formed with a cam surface;
- a second crank member having one end in slide contact with said cam surface, an intermediate portion pivotally connected to said main frame; and another end pivotally connected to said supporting shaft.

10. The image recording apparatus as defined in claim 8 further comprising a separation roller unit pivotally supported to said main frame for providing a meandering sheet path in order to separate said photosensitive pressure sensitive recording medium from said developer medium.

11. The image recording apparatus as defined in claim 10 wherein said separation roller unit comprises a plurality of rollers and a roller supporting member for rotatably supporting said rollers, said roller supporting member being pivotally connected to said main frame, said roller supporting member having a first pivot position where said rollers are in contact with said photosensitive pressure sensitive recording medium and having a second pivot position where said rollers are spaced away therefrom.

12. The image recording apparatus as defined in claim 10 further comprising a second link mechanism connected between said one end portion of said cover member and said separation roller unit.

13. The image recording apparatus as defined in claim 11 further comprising a second link mechanism connected between said one end portion of said cover member and said roller supporting member, said second linking mechanism providing said first pivot position of said roller supporting member upon closing of said cover member, and providing said second pivot position of said roller supporting member upon opening of said cover member.

14. An image recording apparatus for recording an image on an elongated recording medium, said apparatus comprising:
- a main frame;
- a cover member pivotally connected to said main frame;
- a sheet roll cartridge disposed within said main frame for accommodating elongated recording medium therein;
- an exposure unit provided in said main frame for exposing said elongated recording medium to light;
- a developing unit provided in said main frame for developing said elongated recording medium;
- a cartridge support shaft supported by said main frame for detachably supporting said sheet roll cartridge;
- at least one roller movably supported by said main frame for defining a sheet path of said elongated recording medium within said main frame;

a first link mechanism connecting between said cover member and said cartridge support shaft, said cartridge support shaft being axially movable in one direction upon opening of said cover member and movable in opposite direction upon closing thereof; and, a second link mechanism connecting between said cover member and said roller, said roller being movable in a first direction upon opening of said cover and movable in a second direction upon closing thereof.

* * * * *